United States Patent
Ahn

(10) Patent No.: US 6,211,734 B1
(45) Date of Patent: Apr. 3, 2001

(54) ACTIVE DISTORTION SIGNAL GENERATING CIRCUIT FOR A LINE-DISTORTION TYPE POWER AMPLIFIER

(75) Inventor: Kwang Eun Ahn, Kyonggi-do (KR)

(73) Assignee: LG Information & Communications, Ltd., Seoul (KR)

( * ) Notice: Subject to any disclaimer, the term of this patent is extended or adjusted under 35 U.S.C. 154(b) by 0 days.

(21) Appl. No.: 09/451,106

(22) Filed: Nov. 30, 1999

(30) Foreign Application Priority Data

Dec. 26, 1998 (KR) .................................................. 98/26586

(51) Int. Cl.[7] ................................ H03F 1/26; H03F 3/68; H04K 1/02
(52) U.S. Cl. ........................ 330/149; 330/124 R; 375/297
(58) Field of Search .............................. 330/124 R, 129, 330/149; 375/296, 297

(56) References Cited

U.S. PATENT DOCUMENTS

| | | | |
|---|---|---|---|
| 5,576,660 | * 11/1996 | Pouysegur et al. | ................... 330/149 |
| 5,877,653 | * 3/1999 | Kim et al. | ............................. 330/149 |
| 5,966,049 | * 10/1999 | Yuen et al. | ........................ 330/124 R |
| 6,081,156 | * 7/2000 | Choi et al. | ............................. 330/149 |
| 6,104,241 | * 8/2000 | Cova et al. | ............................ 330/149 |
| 6,111,462 | * 8/2000 | Mucenieks et al. | .................. 330/149 |

* cited by examiner

*Primary Examiner*—Robert Pascal
*Assistant Examiner*—Patricia T. Nguyen
(74) *Attorney, Agent, or Firm*—Fleshner & Kim, LLP

(57) ABSTRACT

An active distortion signal generating circuit for removing linear distortions in a power amplifier includes a linear processing circuit that receives a linear path signal and outputs a linear signal; a nonlinear processing circuit that receives a nonlinear path signal and outputs a distortion signal; and an output circuit that adds the linear signal and the distortion signal to obtain a first sum signal, that adds the first sum signal to a duplicate first sum signal to obtain a second sum signal and that generates control signals utilizing the linear signal, the distortion signal, the first sum signal and the second sum signal; and a variable attenuator and phase shifter that adjusts the distortion signal based upon the control signals. The active distortion signal generating circuit compensates the amplitude and phase errors of the input signal such that no input signal component appears at the output of the active distortion signal generating circuit.

21 Claims, 3 Drawing Sheets input signal component

ACTIVE DISTORTION SIGNAL GENERATING CIRCUIT FOR A LINE-DISTORTION TYPE POWER AMPLIFIER

BACKGROUND OF THE INVENTION

1. Field of the Invention

The invention relates to a power amplifier and more particularly, to compensating distortions appearing in the output of the power amplifier.

2. Background of the Related Art

Typically, a nonlinear distortion appears in the output of a power amplifier. To remove such distortion, an active distortion signal generating circuit is often implemented in a linearizer. FIG. 1 shows a general construction of an active distortion signal generating circuit and FIG. 2 shows a general linearizer connected to a power amplifier.

Referring to FIG. 1, the active distortion signal generating circuit is divided into a linear path and a nonlinear path. The linear path includes a first signal attenuator 2 and a first amplifier 3 for amplifying and outputting a signal having the same phase as the input signal. The nonlinear path amplifies and outputs a signal having a phase difference of 90° from the input signal. The separation of the input signal into a signal of the same phase and a signal having a phase difference of 90° with respect to the input signal is performed by a hybrid coupler 1.

Furthermore, the nonlinear path includes a second amplifier 4 that amplifies one output signal of the hybrid coupler 1. The nonlinear path also includes a second signal attenuator 5 connected to the output terminal of the second amplifier 4. The second signal attenuator 5 generates a distortion signal having a characteristic similar to a distortion signal appearing at the output of the power amplifier (not illustrated). Finally, the output of the second signal attenuator 5 is coupled to the output of the first amplifier 3 by a second hybrid coupler 6, and the coupled signal is input to the power amplifier.

In an ideal active distortion signal generating circuit, components of the input signal should not appear at the output. Only the distortion signal generated through the nonlinear path should be output. Also, the hybrid coupler should separate the input signal into the two signals having an exact phase difference of 90° while the operation of the linear and nonlinear paths should have the same time delay. In actual application, however, the separated signals do not have an exact phase difference of 90° and the time delays in the operational paths do not coincide.

Referring to FIG. 2, an output of a linearizer 21 is input to a power amplifier 22. The linearizer 21 includes a divider 21a that divides the input signal into two paths, a first linear path for maintaining the input signal and a second non-linear path for generating a counterpart distortion signal to remove the distortion component generated by the power amplifier 22.

The second non-linear path includes an active distortion signal generating circuit 21b as described with reference to FIG. 1, and a variable attenuator and a variable phase shifter 21c that varies the amplitude and phase of the output signal from the active distortion signal generating circuit 21b. The first linear path has a delay line 21d that compensates a time error between the input and the output signals of the variable attenuator and variable phase shifter 21c. The linearizer 21 further includes a combiner 21e that adds the input signal from the second path and the distortion signal from the first path, and outputs the sum to the power amplifier 22. The operation of the linearizer as described above will next be explained.

A signal input to the linearizer 21 is processed by the distortion signal generating circuit 21b. Namely, the signal is processed through the linear path wherein the characteristic of the input signal is maintained, and is processed through the nonlinear path by which the distortion component generated by the power amplifier 22 may controlled. Passing through the delay line 21d, the signal is also input to the combiner 21e. The combiner 21e adds the signal from the delay line 21d to the output signal of the active distortion signal generating circuit 21b and outputs the sum to the line-distortion type power amplifier 22.

As discussed above, the active distortion signal generating circuit 21b uses two paths, the linear path and the nonlinear path to generate the signal having a similar distortion characteristic to the output of the power amplifier 22. By adding the input signal to a signal having a phase difference of 180° with respect to the input signal, the active distortion signal generating circuit 21b removes the original signal from the output. As a result, only the nonlinear signal appears at the output.

Moreover, the output of the active distortion signal generating circuit 21b is adjusted to have a signal characteristic similar to the output of the power amplifier 22 by the variable attenuator and variable phase shifter 21c. The variable attenuator and variable phase shifter 21b may be implemented within the active distortion signal generating circuit 21b rather than as a separate unit shown in FIG. 2. In any case, the variable attenuator and variable phase shifter 21c adjusts the amplitude and phase errors of the signals passing through the linear and nonlinear paths of the distortion signal generating circuit 21b so that the input signal component does not appear at the output of the active distortion signal generating circuit 21b.

FIGS. 3A to 3D are waveform diagrams illustrating signals appearing at various points of the device 21 in FIG. 2. Namely, FIG. 3A shows a signal at the linear path of the active distortion signal generating circuit, and FIG. 3B shows a signal at the nonlinear path of the active distortion signal generating circuit. FIG. 3C shows a signal when an error in the amplitude and phase exist in the linear and nonlinear paths, and FIG. 3D shows a signal when an error in the amplitude or phase do not exist in the linear and nonlinear paths.

An error in the amplitude and phase may be generated in the operating condition of the linear and nonlinear paths of the circuit or circuit elements regardless of the variable attenuator and variable phase shifter. If such errors exist, the input signal component may appear at the output of the active distortion signal generating circuit as shown in FIG. 3C. In such case, the output signal of the active distortion signal generating circuit including an input signal component is input to the power amplifier, causing the performance of the power amplifier to deteriorate.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Accordingly, an object of the invention is to solve at least the problems and disadvantages of the related art.

An object of the invention is to improve the performance of a power amplifier.

Another object of the invention is to provide a more effective active distortion signal generating circuit for a linearizer.

A further object of the invention is to provide an active distortion signal generating circuit that can compensate for amplitude and phase errors of the distortion signal component so that an input signal component does not appear at the output of the active distortion signal generating circuit.

To achieve the objects and in accordance with the purposes of the invention, as embodied and broadly described herein, the active distortion signal generating circuit for a line-distortion type power amplifier includes a divider that divides an input signal into a signal for a linear path and another signal for a nonlinear path to generate a distortion signal; a branch-line coupler that adds the signals of the linear path and the nonlinear path to obtain amplitude and phase errors between the signals; a combiner, connected to outputs of the branch-line coupler, that adds the signals of the linear path and the nonlinear path; a control signal generating unit that detects the amplitude error between the signals of the linear path and the nonlinear path using the two input signals of the branch-line coupler and an output signal of the combiner, detects the phase error between the signals of the linear path and the nonlinear path using the two input signals of the branch-line coupler and one of the output signal of the branch-line coupler, and generates control signals for varying the amplitude and phase of the signal of the nonlinear path; and a variable attenuator and variable phase shifter that adjusts the signal of the nonlinear path so that the signal of the nonlinear path has the same amplitude as the signal of the linear path and a phase difference of 180° from the signal of the linear path based upon control signals from the control signal generating unit.

The control signal generating unit includes a power detector that detects a power of a radio frequency (RF) signal; and an operational amplifier that provides control voltages. Also, the signal of the linear path divided by the divider is input to the branchline coupler through a first signal attenuator and a linear amplifier. Similarly, the signal of the nonlinear path divided by the divider is input to the branch-line coupler through a nonlinear amplifier, a second signal attenuator, and the variable attenuator and variable phase shifter. Also, the control signal generating unit detects the amplitude error between the signals of the linear path and the nonlinear path by comparing the two input signals of the branch-line coupler and the output signal of the combiner, and detects the phase error between the signals of the linear path and the nonlinear path by comparing the two input signals of the branch-line coupler and one of the output signals of the branch-line coupler.

The invention can also be achieved in whole or in part by an active distortion signal generating circuit comprising a linear processing circuit that receives a linear path signal and outputs a linear signal; a nonlinear processing circuit that receives a nonlinear path signal and outputs a distortion signal; an output circuit that adds the linear signal and the distortion signal to obtain a first sum signal, that adds the first sum signal to a duplicate first sum signal to obtain a second sum signal and that generates control signals utilizing the linear signal, the distortion signal, the first sum signal and the second sum signal, and a variable attenuator and phase shifter circuit that adjusts the distortion signal based upon the control signals.

Further, the invention can be achieved in whole or in part by an active distortion signal generating circuit comprising linear processing means for receiving a linear path signal and outputting a linear signal; nonlinear processing means for receiving a nonlinear path signal and outputting a distortion signal; output means for adding the linear signal and the distortion signal to obtain a first sum signal, adding the first sum signal to duplicate a first sum signal to obtain a second sum signal, and for generating control signals utilizing the linear signal, the distortion signal, the first sum signal and the second sum signal; and variable attenuator and phase shifter means for adjusting the distortion signal based upon the control signals.

Furthermore, the invention can be achieved in whole or in part by a method for generating a distortion signal comprising processing a linear path signal to output a linear signal; processing a nonlinear path signal to output a distortion signal; combining the linear signal and the distortion signal to obtain a first sum signal; adding the first sum signal to a duplicate first sum signal to obtain a second sum signal, generating control signals utilizing the linear signal, the distortion signal, the first sum signal and the second sum signal, and adjust the distortion signal based upon said control signals.

Additionally, the invention can be achieved in whole or in part by an active distortion signal generating circuit comprising a linear processing circuit that receives a first signal and outputs a second signal; a nonlinear processing circuit that receives a third signal and outputs a fourth signal; an output circuit that receives and adds the second and fourth signals to obtain a fifth signal adds the fifth signal to a duplicate fifth signal to obtain a sixth signal, and generates a seventh signal utilizing the second, fourth, fifth and sixth signals; and a variable attenuator and phase shifter circuit that adjusts the fourth signal based upon the seventh signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

Figure 1:
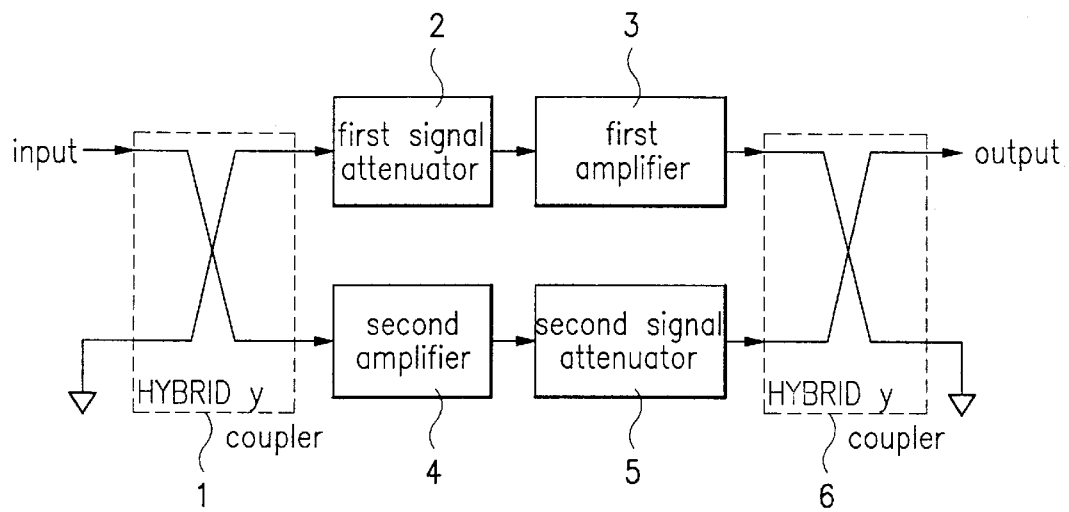
FIG. 1 is a block diagram of a typical active distortion signal generating circuit for a linearizer.
Figure 2:
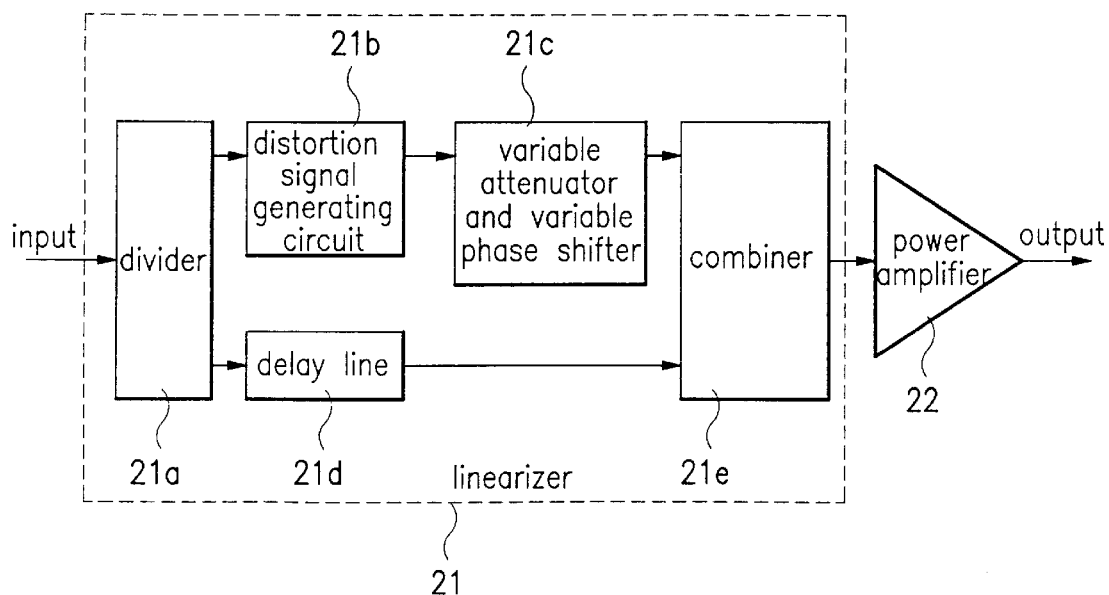
FIG. 2 is a block diagram of a linearizer with the active distortion signal generating circuit of FIG. 1.
Figure 3A:
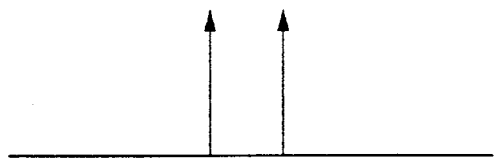
FIGS. 3A to 3D are waveform diagrams illustrating signals appearing at various points in the active distortion signal generating circuit of FIG. 1.
Figure 3B:
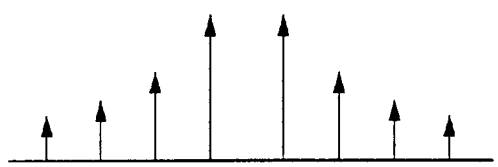
Figure 3C:
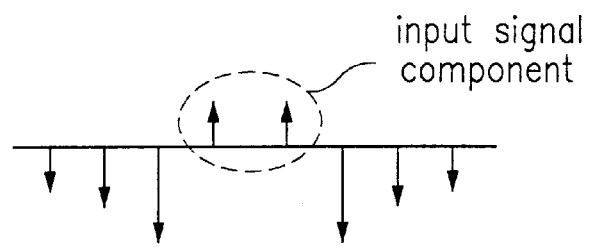
Figure 3D:
Figure 4:
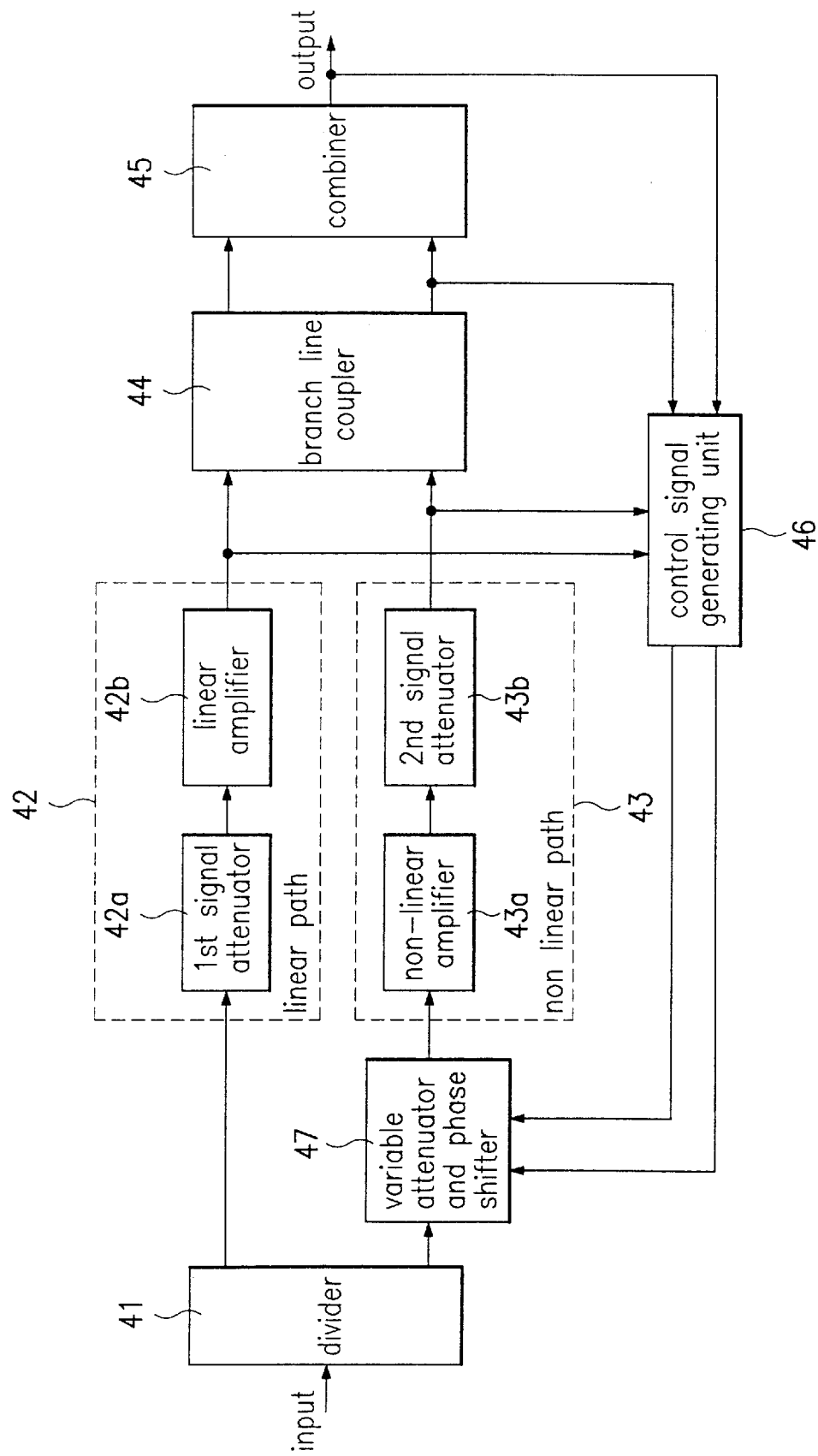
FIG. 4 is a block diagram of an active distortion signal generating circuit according to a preferred embodiment of the invention.

FIG. 4 shows a block diagram of an active distortion signal generating circuit according to a preferred embodiment of the invention. In the invention, signals from linear and nonlinear paths of the active distortion signal generating circuit are controlled to have the same amplitude and phase. Also, a variable attenuator and a variable phase shifter is implemented to adjust a signal output from the nonlinear path to have the same amplitude as the linear path signal with a phase difference of 180° from the linear path signal. Generally, a control signal generating unit outputs control signals so that the variable attenuator and variable phase shifter can appropriately adjust the amplitude and phase of the nonlinear path signal.

Referring to FIG. 4, an active distortion signal generating circuit according to the invention includes a divider 41 that divides an input signal into a linear path signal and a nonlinear path signal. The linear path 42 maintains the input signal, while the nonlinear path 43 generates a distortion signal. A branch-line coupler 44 adds the signals output from the linear path 42 and the nonlinear path 43 to obtain the phase error between the signals output from the linear path 42 and the nonlinear path 43. A combiner 45 connected to the branch-line coupler 44 adds the signals output from the branch-line coupler 44 to obtain the amplitude error between the signals output from the linear path 42 and the nonlinear path 43.

The active distortion signal generating circuit, shown in FIG. 4, further includes a control signal generating unit 46 that receives the input signals and one of the output signals of the branch-line coupler 44 and receives the output from the combiner 45 to output control signals for varying the amplitude and phase of the signal of the nonlinear path 43. The circuit further includes a variable attenuator and variable phase shifter 47 that adjusts the signal output of the nonlinear path 43 based upon the control signals so that the signal has the same amplitude as the signal output from the linear path 42 with a phase difference of 180°.

The linear path 42 includes a first signal attenuator 42a and a linear amplifier 42b for maintaining the input signal, and the nonlinear path 43 includes a nonlinear amplifier 43a and a second signal attenuator 43b for generating the distortion signal. Also, the control signal generating unit 46 of the invention includes a power detector that detects the power of a RF signal, and an operational amplifier that provides control voltages. The operation of the circuit shown in FIG. 4 will next be explained.

The divider 41 first divides the input signal and outputs the divided signals to the linear path 42 and the nonlinear path 43. Via the first signal attenuator 42a and the linear amplifier 42b, the linear path 42 amplifies the input signal without distorting the amplitude and phase of the input signal. The nonlinear path 43 generates a distortion signal having a characteristic similar to the amplitude and phase of an output signal of a power amplifier (not illustrated).

The variable attenuator and variable phase shifter 47 is connected to the input terminal of the nonlinear path 43 and adjusts the signal output from the nonlinear path 43 so that the linear path signal and the nonlinear path signal have the same amplitude and an accurate phase difference of 180°. The variable attenuator and phase shifter 47 adjusts the signal input to the nonlinear path 43 based upon control signals received from the control signal generating unit 46.

To generate the control signals, the branch-line coupler 44 adds the signals from the linear and nonlinear paths and outputs the sum to the control signal generating unit 46 through one of the output terminals of the branch-line coupler 44. The branch-line coupler 44 also outputs the sum of the linear and nonlinear path signals to the combiner 45. The combiner 45 adds the two signals received from the branch-line coupler 44 and outputs a vector sum of the two signals.

More particularly, the branch-line coupler 44 and the combiner 45 are utilized to perform an adaptive signal cancellation. Thus, the control signal generating unit 46 utilizes the two signals input to the branch-line coupler 44 and the output signal of the combiner 45 to detect an amplitude error between the linear and nonlinear path signals. The control signal generating unit 46 also utilizes the two signals input to the branch-line coupler 44 with one of the output signals of the branch-line coupler 44 to detect a phase error between the linear and nonlinear path signals.

Therefore, the control signal generating unit 46 detects the amplitude error and the phase error between the signals from the linear path 42 and the nonlinear path 43 using the branch-line coupler 44 and the combiner 45. Thereafter, the control signal generating unit 46 generates the control signals to control the variable attenuator and variable phase shifter 47 based upon the detected errors. Thus, the variable attenuator and variable phase shifter 47 receives the control signals from the control signal generating unit 46, and adjusts the signal from the nonlinear path 43 so that the signal has the same amplitude as the signal from the linear path 42 and a phase difference of 180° from the signal from the linear path 42.

By compensating for the amplitude and phase errors of the nonlinear path signal, no input signal component appears at the output of the active distortion signal generating circuit, thereby improving the performance of the power amplifier.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An active distortion signal generating circuit, comprising:
    a divider that divides an input signal into a linear path signal and a non linear path signal;
    a linear processor that receives the linear path signal and outputs a linear signal;
    a nonlinear processor that receives the nonlinear path signal and outputs a distortion signal;
    a branchline coupler that adds the linear signal and the distortion signal to obtain a first sum signal, said branchline coupler outputting the first sum signal through two terminals;
    a combiner that adds the outputs from said two terminals of the branchline coupler and outputs a second sum signal;
    a control signal generating unit that generates control signals utilizing the linear signal, the distortion signal, the first sum signal and the second sum signal, said control signal generating unit outputting the control signals; and
    a variable attenuator and a variable phase shifter that adjusts the distortion signal based upon the control signals.

2. The circuit of claim 1, wherein said linear processor comprises:
    a signal attenuator that attenuates the linear path signal; and
    a linear amplifier that amplifies the attenuated linear path signal and outputs the linear signal.

3. The circuit of claim 1, wherein said nonlinear processor comprises:
    a nonlinear amplifier that amplifies the nonlinear path signal; and
    a signal attenuator that attenuates the amplified nonlinear path signal and outputs the distortion signal.

4. The circuit of claim 1, wherein said control signal generating unit generates control signals to adjust an amplitude difference between the linear signal and the distortion signal by comparing the linear signal and the distortion signal to the second sum signal; and wherein said control signal generating unit generates control signals to adjust a phase difference between the linear signal and the distortion signal by comparing the linear signal and the distortion signal to the first sum signal.

5. The circuit of claim 1, wherein said variable attenuator and variable phase shifter controls the nonlinear path signal to adjust the distortion signal.

6. The circuit of claim 5, wherein said variable attenuator and variable phase shifter controls the nonlinear path signal such that the distortion signal has the same amplitude as the linear signal and a phase difference of 180 degrees from the linear signal.

7. A method for generating a distortion signal, comprising:

dividing an input signal into a linear path signal and a nonlinear path signal;

processing the linear path signal to output a linear signal;

processing the nonlinear path signal to output a distortion signal;

combining the linear signal and the distortion signal through a branchline coupler to obtain a first sum signal, and outputting the first sum signal through two terminals of the branchline coupler;

adding the outputs from said two terminals of the branchline coupler through a combiner and outputting a second sum signal;

generating control signals utilizing the linear signal, the distortion signal, the first sum signal and the second sum signal; and adjusting the distortion signal based upon said control signals.

8. The method of claim 7, wherein the step of generating control signals further comprises generating control signals to adjust an amplitude difference between the linear signal and the distortion signal by comparing the linear signal and the distortion signal to the second sum signal; and generating control signals to adjust a phase difference between the linear signal and the distortion signal by comparing the linear signal and the distortion signal to the first sum signal.

9. The method of claim 7, wherein the step of adjusting the distortion signal further comprises controlling the nonlinear path signal using a variable attenuator and variable phase shifter.

10. The method of claim 9, wherein the step of controlling the nonlinear path signal further comprises controlling the nonlinear path signal such that the distortion signal has the same amplitude as the linear signal and a phase difference of 180 degrees from the linear signal.

11. An active distortion signal generating circuit, comprising:

a dividing circuit for dividing an input signal into a linear path signal and a nonlinear path signal;

a linear processing circuit for linearly processing the linear path signal and outputting a linear signal;

a nonlinear processing circuit for nonlinearly processing the nonlinear path signal and outputting a distortion signal;

a first adding circuit for adding the linear signal and the distortion signal to obtain a first sum signal, said first adding circuit outputting the first sum signal through two terminals;

a second adding circuit for adding the outputs from said two terminals of the first adding circuit and outputting a second sum signal;

a generating circuit for generating control signals utilizing the linear signal, the distortion signal, the first sum signal and the second sum signal, said generating circuit outputting the control signals; and an adjusting circuit for adjusting the distortion signal based upon the control signals.

12. The circuit of claim 11, wherein said generating circuit generates control signals to adjust an amplitude difference between the linear signal and the distortion signal by comparing the linear signal and the distortion signal to the second sum signal, and generates control signals to adjust a phase difference between the linear signal and the distortion signal by comparing the linear signal and the distortion signal to the first sum signal.

13. The circuit of claim 11, wherein said adjusting circuit controls the nonlinear path signal to adjust the distortion signal.

14. The circuit of claim 13, wherein said adjusting circuit controls the nonlinear path signal such that the distortion signal has the same amplitude as the linear signal and a phase difference of 180 degrees from the linear signal.

15. An active distortion signal generating circuit, comprising:

linear processing means for receiving a linear path signal and outputting a linear signal;

nonlinear processing means for receiving a nonlinear path signal and outputting a distortion signal;

output means for adding the linear signal and the distortion signal to obtain a first sum signal, adding the first sum signal to a duplicate first sum signal to obtain a second sum signal, and for generating control signals utilizing the linear signal, the distortion signal, the first sum signal and the second sum signal; and variable attenuator and phase shifter means for adjusting the distortion signal based upon the control signals.

16. The circuit of claim 15, further comprising:

dividing means for dividing an input signal into the linear path signal and the nonlinear path signal, said variable attenuator and phase shifter means being coupled between said dividing means and said nonlinear processing means and responsive to the control signals.

17. The circuit of claim 15, wherein the output means comprises:

branchline coupler means for adding the linear signal and the distortion signal to obtain a first sum signal, said branchline coupler means outputting the first sum signal through two terminals;

combiner means for adding the outputs from said two terminals of the branchline coupler means and outputting the second sum signal; and control signal generating means for generating and outputting the control signals utilizing the linear signal, the distortion signal, the first sum signal and the second sum signal.

18. The circuit of claim 15, wherein said linear processing means comprises:

signal attenuator means for attenuating the linear path signal; and linear amplifier means for amplifying the attenuated linear path signal and outputting the linear signal.

19. The circuit of claim 15, wherein said nonlinear processing means comprises:
  nonlinear amplifier means for amplifying the nonlinear path signal; and
  signal attenuator means for attenuating the amplified nonlinear path signal and outputting the distortion signal.

20. The circuit of claim 17, wherein said control signal generating means generates control signals to adjust an amplitude difference between the linear signal and the distortion signal by comparing the linear signal and the distortion signal to the second sum signal; and wherein said control signal generating means generates control signals to adjust a phase difference between the linear signal and the distortion signal by comparing the linear signal and the distortion signal to the first sum signal.

21. The circuit of claim 15, wherein said variable attenuator and variable phase shifter means controls the nonlinear path signal to adjust the distortion signal.

\* \* \* \* \*